United States Patent [19]
Gale et al.

[11] Patent Number: 5,539,620
[45] Date of Patent: Jul. 23, 1996

[54] ELECTRONIC MODULES, CIRCUIT PACKS AND SEALING ARRANGEMENTS

[75] Inventors: Geoffrey N. Gale, Nepean; Dieter O. Marx, Kanata, both of Canada

[73] Assignee: Northern Telecom Limited, Montreal, Canada

[21] Appl. No.: 261,504

[22] Filed: Jun. 16, 1994

[51] Int. Cl.⁶ .................................................. H05K 9/00
[52] U.S. Cl. .................... 361/800; 361/818; 174/35 R; 439/607
[58] Field of Search .................................. 361/730, 752, 361/753, 759, 800, 816, 818; 439/607–610; 174/35 R

[56] References Cited

U.S. PATENT DOCUMENTS

| | | | |
|---|---|---|---|
| 4,730,237 | 3/1988 | Locker | 361/759 |
| 4,758,928 | 7/1988 | Wierec et al. | 361/759 |
| 5,266,053 | 11/1993 | Jamet et al. | 439/607 |

*Primary Examiner*—Bot L. Ledynh
*Attorney, Agent, or Firm*—R. J. Austin

[57] ABSTRACT

In an electronic module two or more circuit packs are included in a housing and are connected to a printed circuit board extending laterally of the circuit packs and also within the housing. The housing is an electromagnetic radiation shield. The printed circuit board has a single connector for connection to a back plane. This structure avoids misalignment and insertion force problems found when two or more packs are housed within a housing and are individually connected to a back plane.

10 Claims, 3 Drawing Sheets

ELECTRONIC MODULES, CIRCUIT PACKS AND SEALING ARRANGEMENTS

This invention relates to electronic modules, circuit packs and sealing arrangements.

In electronic fields, printed circuit boards each carrying electronic components and referred to as circuit packs, are mounted within shelves for connection at rear edges of the boards to other circuit boards called back planes. For this purpose, the packs are slidable into and out of fronts of the shelves in known manner.

Technology now requires circuit packs to be shielded from external EMI forces and also to protect outside equipment and other circuit packs and components from EMI forces generated by each of the packs themselves. To this end, circuit packs are now conventionally housed within EMI shields which are in the form of shield housing surrounding the packs thereby forming an electronic module. It has been found convenient where EMI conditions allow for this, to place two or more circuit packs together within the same shield housing. This shield housing is then inserted into a receiving station within a shelf for electrical connection of the two or more circuit packs to the back plane. However, connection of any particular circuit pack to a back plane requires a specific insertion force to insert the pins of the back plane into a connector at the rear of the pack. If two or more circuit packs are included within a single shield housing to form an electronic module, the insertion force increases as the number of connectors increases. In addition, with two or more circuit packs within a single module, it is extremely difficult to align simultaneously all of the connectors of the packs with the pins on the back plane. The increased insertion force together with the alignment problem may make it very difficult to insert an electronic module into a shelf and effect connection of each pack into the back plane.

The present invention seeks to provide an electronic module which will lessen or avoid the above problem.

Accordingly, the present invention provides an electronic module comprising a plurality of circuit packs relatively disposed with major surfaces of the packs laterally spaced apart, the circuit packs having rear ends and being electrically interconnected at their rear ends to a rearwardly located printed circuit board extending laterally of the circuit packs, the circuit packs and the rearwardly located circuit board housed together within a housing for providing an electromagnetic radiation shield, and the rearwardly located circuit board having a single connector extending in a rearward direction and accessible exteriorly of the housing for connection to a back plane.

As may be seen in structures according to the invention, each circuit pack is individually interconnected with the rearwardly located printed circuit board so that the insertion force for each pack is easily overcome as the electronic module is being constructed. Also, during mounting of the electronic module in a shelf, a single connector insertion force for connecting the rearwardly located circuit board to the back plane is again easily accommodated. Also alignment problems, such as when two or more circuit packs housing individual connectors are simultaneously connected into a back plane, are avoided.

Preferably in modules according to the invention described above, the circuit packs may be electrically interconnected by circuitry to the rearwardly located circuit board thereby avoiding back plane design for this particularly purpose and thus rendering simplification of back plane design.

The invention also includes an assembly of an electronic shelf having a front with an opening for insertion of electronic modules into receiving stations of the shelf and the back plane extending across a rear of the shelf and having electrically conductive pins projecting forwardly of the back plane; and a plurality of electronic modules each comprising a plurality of circuit packs relatively disposed with major surfaces of the packs laterally spaced apart, the circuit packs having ends and being electrically interconnected at their rear ends to a rearwardly located printed circuit board extending laterally of the circuit packs, the circuit packs and the rearwardly located circuit board housed together within a housing for providing an electromagnetic radiation shield, and the rearwardly located circuit board having a single connector extending in a rearward direction, accessible exteriorly of the housing, and electrically connected to the back plane.

Another problem which exists is the radiation of electromagnetic forces outwardly from the region of the connection of circuit packs with the back plane. Conventionally, means are provided for shielding against EMI radiation, but there exist problems in the design and operation of such shielding. Conventionally, the back plane is provided with a forwardly projecting EMI shield wall for receiving the connector of a circuit pack and resiliently flexible shielding fingers of the connector engage and slidably move across sides of the wall during engagement of the connector and the back plane. This sliding movement is accompanied by flexure of the fingers laterally of the direction in which the connector movement takes place as it engages the back plane. A sealing connection between flexing fingers and the walls is thus obtained. This type of arrangement is inordinately expensive. The fingers are mechanically weak and become exposed with the circuit pack disconnected from its shelf, whereby the fingers may sustain physical damage which could deleteriously affect making and sustaining future effective EMI seals. In addition, the fingers need to be positioned correctly for sealing with the shield walls and misalignment may occur. This misalignment is compensated by the degree of flexure of the fingers, but does of necessity add to the insertion resistive force exerted by pin insertion into the connector at the rear of the circuit pack thereby requiring a greater insertion force to make a correct connection with the back plane.

The present invention also provides an electronic module which minimizes the latter problem.

According to a yet further aspect of the invention there is provided an electronic module for insertion into an electronic shelf and having a rear end and a connector at the rear end for electrical interconnection to a back plane, the module further comprising an EMI shielding means extending around the connector, the shielding means having an electromagnetic sealing surface means facing in the rearward direction, the sealing means being resiliently flexibly movable forwardly upon forward pressure being applied to the sealing surface.

With an electronic module as defined in the last preceding paragraph, the contact sliding movement which normally is required between shielding members as the connector moves into the shelf is avoided. With the shielding means of the invention, the sealing surface means faces in the direction of movement of the connector whereby it will abut and resiliently flex against a sealing abutment surface suitably provided by and facing forwardly from the back plane. In view of this, correct alignment of EMI shielding elements laterally of the connector may be avoided as the sealing surface means may be disposed in any position laterally of the connector with the requirement that it forms a seal against such a sealing abutment surface. Thus this module structure enables the width of the sealing abutment surface to be such as to enable substantial freedom of movement of the shielding surface means laterally of the connector while enabling an EMI shielding effect to take place. It should be noted that electronic modules according to the invention defined immediately above may comprise either a circuit pack or an electronic module which includes a plurality of circuit packs housed within an EMI shielding arrangement.

In a preferred arrangement, the shielding means comprises at least one radially resiliently flexible spiral metal member having spirals extending helically along the member. In an unstressed condition gaps may exist between the succeeding spirals and these gaps close as the spirals move closer together during radial inward compression against one side of the member. The spiral metal member is disposed around the connector and has axially aligned circumferentially extending parts of the outer surfaces of the spirals facing rearwardly of the module and providing the sealing surface means, the spirals being resiliently flexible radially relative to the longitudinal axis of the spiral metal member. Support means are provided which allows for radial resilient flexing of the spirals and the metal member may be free to move laterally within the support means. Preferably, the support means is conveniently a U-shaped housing with an opening facing rearwardly of the module. The spiral metal member projects from an opening in the housing with the circumferentially extending parts of the outer surfaces of the spirals disposed outwardly of the housing for sealing contact against the sealing abutment surface on the back plane.

The spiral metal member may have spirals of any convenient cross-section. Preferably, the spiral metal member is formed from flat metal strip the strip oriented so that its width extends in a longitudinal direction of the member and having one major surface facing radially outwards of the metal member. With this arrangement the major surfaces of the spirals provide the sealing surface means and are aligned axially along the member. The shielding member may however be of any other convenient configuration and may for instance be in the form of at least one leaf spring extending alongside the connector and the leaf spring may be a cantilever spring.

Embodiments of the invention will now be described, by way of example, with reference to the accompanying drawings, in which.

Figure 1:
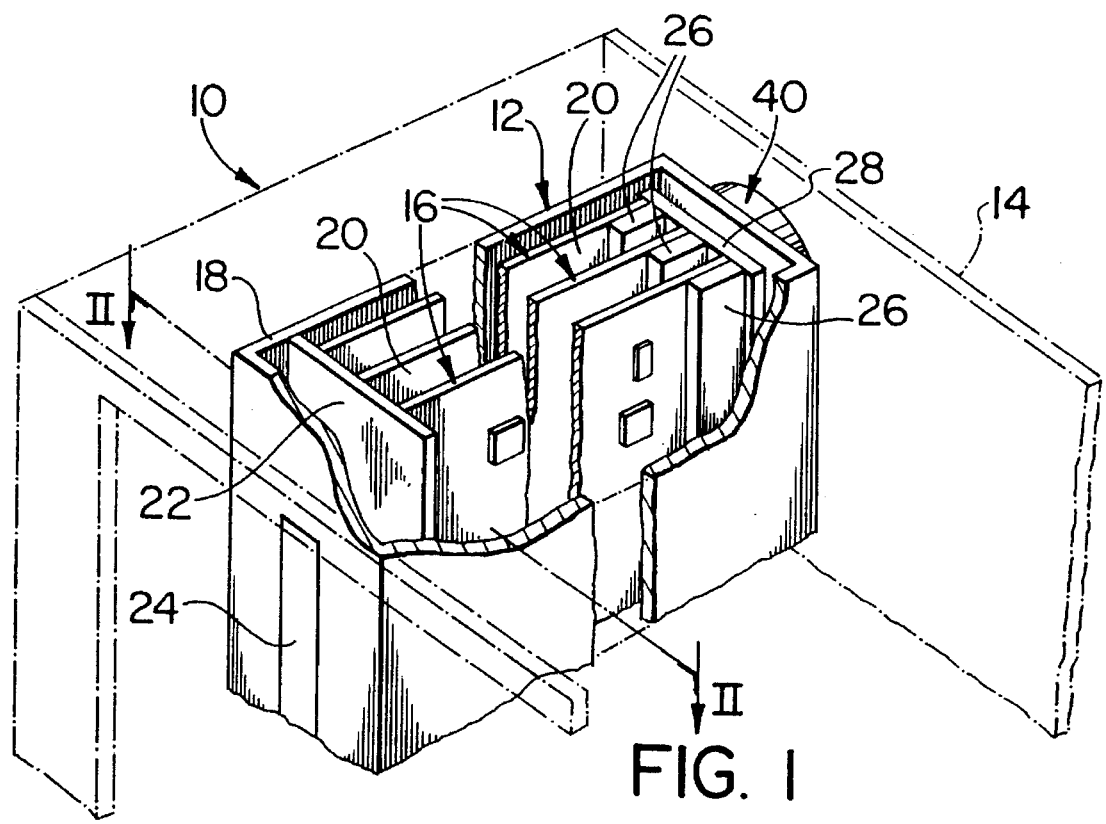
FIG. 1 is an isometric view of an electronic module according to a first embodiment and shown partially in section.
Figure 2:
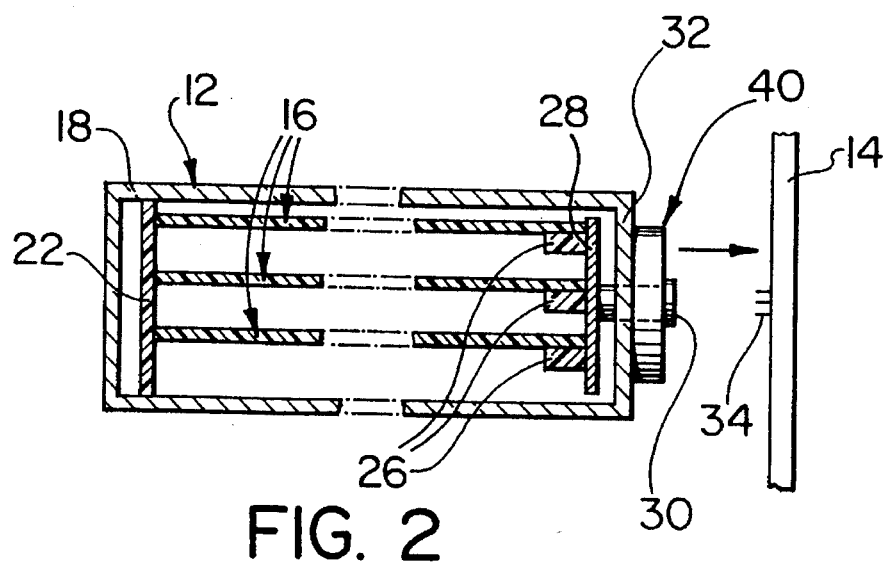
FIG. 2 is a cross-sectional view through the module of FIG. 1 taken along line II—II in FIG. 1.

As shown in FIGS. 1 and 2, in a first embodiment electronic equipment has a shelf 10 shown in chain-dotted outline having receiving stations for receiving electronic modules 12 which are to be connected into a back plane 14.

Each electronic module 12 (one only being shown), comprises a plurality of circuit packs 16 disposed in parallel planes within a metal housing 18 which forms an EMI radiation shield. In the figures, a top of housing 18 is omitted to show details. The three circuit packs 16 have printed circuit boards 20 which are supported at a forward end of the housing 18 by a support wall 22 and connectors 24 on a front end of the housing are electrically connected through the wall 22 to the printed circuit boards as desired.

At rear ends of the printed circuit boards 20 edge connectors 26 are provided and these edge connectors connect each of the printed circuit boards 20 into a rearwardly located printed circuit board 28 which extends, laterally of the planes of the circuit boards 16. Circuit board 28 has a single connector 30 which projects through the rear of the housing 18 and is connected, as will be described in greater detail, into the circuitry of the back plane 14 of the shelf.

The module 12 is assembled with each of the circuit packs 16 being connected individually into the printed circuit board 28 by the connectors 26. In each case therefore the insertion force against connection of the packs 16 is the printed circuit board 28 is offered only by one connector 26. Similarly, when the housing 12 is inserted into the shelf, then only one connector 30 offers an insertion force resistance to the connection into the back plane 14. As may be seen from this therefore with the construction of the embodiment and according to the invention, a multi-circuit pack electronic module such as module 12 may be connected into a back plane with the insertion resistance being offered solely by a single connector. Hence, as the circuit board 28 is interposed between the circuit packs 16 and the back plane, then as the module is inserted into the shelf the circuit packs are not connected simultaneously into the back plane by multiple connectors and hence multiple insertion forces offered by a plurality of connectors into the back plane are avoided. In addition to this, as only a single connector 30 is connected into the back plane 14 then alignment problems such as would occur if two or more connectors were simultaneously connected into the back plane, are avoided. Further advantages are also obtainable. These advantages include, in specific designs, constructions in a single electronic module 12 in which at least one of the circuit packs 16 is connected through the printed circuit board 28 directly into at least one of the other circuit packs 16 while bypassing the back plane 14. As may be seen in this type of situation, this enables the back plane 14 to be of simpler design than would be the case if the circuit packs 16 in a module were connected together through the back plane itself.

It follows therefore that with the use of a plurality of circuit packs within a housing 12 and having a rearwardly positioned circuit board such as board 28 then the total insertion force for the connectors is handled individually from circuit pack to circuit pack and total insertion force is minimized for connection of the module to the back plane.

Figure 3:
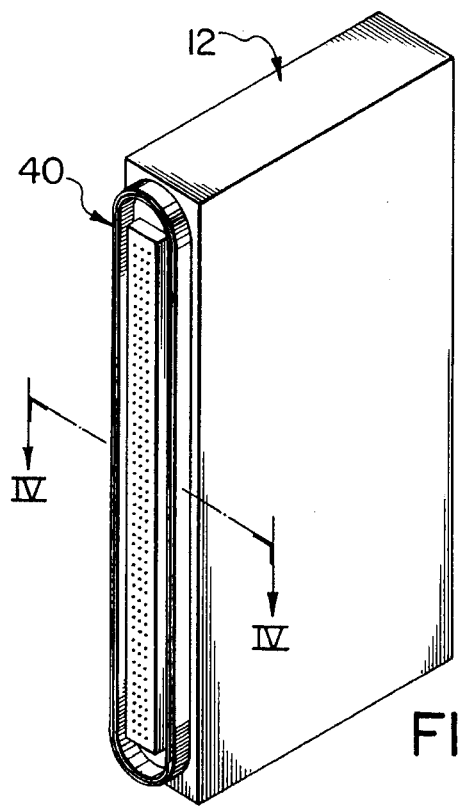
FIG. 3 is an isometric view from a rear end of the electronic module to show a sealing arrangement for EMI shielding.
Figure 4:
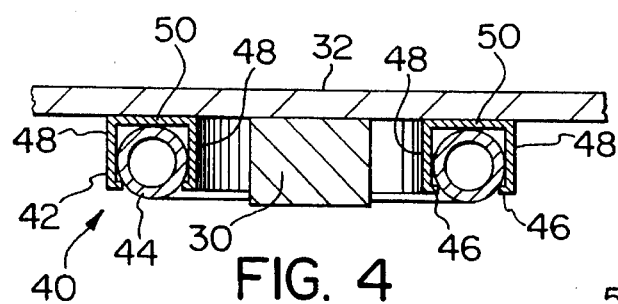
FIG. 4 is an enlarged view of part of the EMI shield taken along line IV—IV in FIG. 3.
Figure 5:
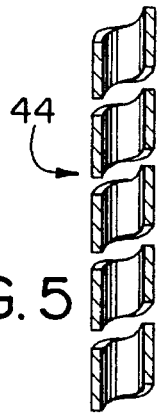
FIG. 5 is a cross-sectional view along part of a shielding member provided in the EMI shield of the electronic module.

At the rear end of the module 12, there is an EMI sealing arrangement which provides distinct advantages as will now be described. As may be seen from FIG. 2, the connector 30 projects through a rear wall 32 of the housing 12 and is connected into circuit pins 34 extending forwardly from the back plane 14. The back plane 14 is provided with a conventional guide 36 (FIG. 7) which surrounds the pins 34 for guiding the connector 30 into alignment with the pins. As shown particularly by FIG. 3, from the rear wall 32, an EMI sealing means 40 projects. As shown in FIG. 4, the seal 40 comprises an elongate annular track 42 which is a U-shaped metal housing secured by its base to the rear wall 32 extending completely around the connector 30. The shielding means includes an EMI shielding member retained within the track 42. This shielding member comprises a resiliently flexible spiral metal element 44 which extends along the track and is retained within the track by two lips 46 of the track extending inwardly towards each other at the free end of the arms of the U. The metal element 44 is of sufficient width to occupy the space between the two arms 48 of the track and abuts against the base 50 of the U of the track so as to cause portions of each of the spirals to extend between the lips 46 so as to protrude therefrom. As shown by FIG. 5, the spiral metal member is formed from a flat strip which is wound into the spiral and is orientated with the width of the strip extending longitudinally of the spiral as shown. In this case, outer surfaces of the spirals lie along a longitudinal line of the spiral in any chosen axial section of the member. The parts of the spiral element extending outwardly between the lips 46 face rearwardly with outer surfaces aligned along the length of the element and provide sealing surface means to engage a sealing abutment surface of the back plane 14 when the module 12 is located within the shelf.

Figure 6:
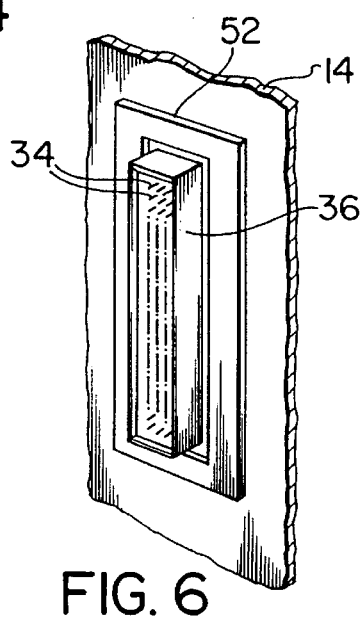
FIG. 6 is an isometric view of the front face of part of the back plane to which the electronic module is to be fitted.
Figure 7:
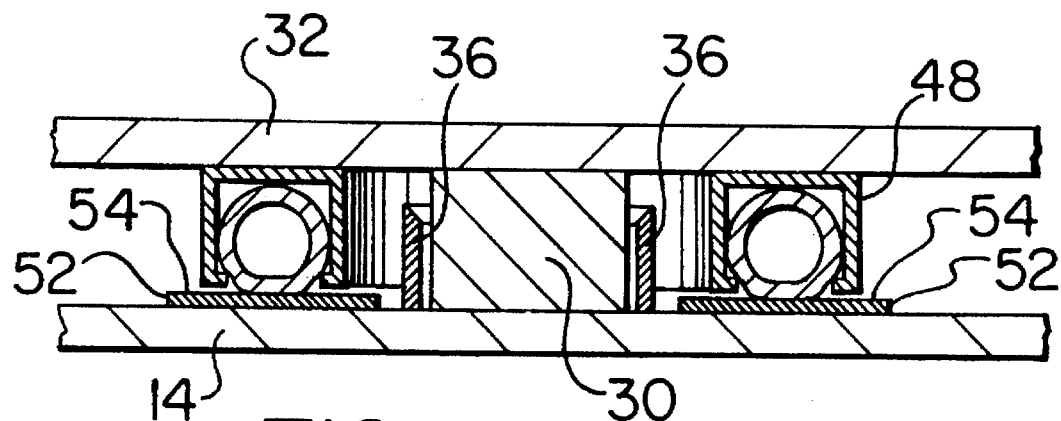
FIG. 7 is a cross-sectional view of the assembly of module and back plane and similar to FIG. 2 but showing the details to larger scale.

As shown by FIGS. 6 and 7, the sealing abutment surface of the back plane, in respect of each module 12, comprises a flat planar electrically conductive strip e.g. copper, which extends around the guide 36, is secured to the surface of the back plane, and has a ground line (not shown) extending through the back plane for connection to ground in use. The strip 52 is of rectangular section as shown in FIGS. 6 and 7 with its sealing abutment surface 54 being planar.

In use, when the module 12 is fitted into the shelf, the connector 30 is guided by the guide 36 for alignment and connection to the pins of the board. As the module moves towards the board, the sealing element 44 engages the surface 54 completely around the connector 30 and guide 36. As movement of the module proceeds to its final sealing position, the parts of the spirals of the element 44 which project outwardly from between the lips 46 are resiliently compressed radially inwards of the spiral member by resistance offered by the surface 54 (FIG. 7). As this occurs, the space between the spirals narrows so that the contact against the surface 54 is substantially continuous around the whole of the surface. As may be seen from FIG. 7, the spiral may be located in position within the track 42 so as to have some freedom of movement between the walls 48 while contacting the rear wall 50 which urges the spiral member outwardly between the lips 46. Alternatively, the spiral member may be constrained between the walls 48 in addition to contacting the rear wall 50.

The sealing arrangement for the module 12 does not comprise flimsy resilient fingers which are exposed before the module is fitted into a shelf and which could become damaged due to mishandling. Instead, the spiral element 44 is substantially wholly protected by the track 42 with only a small part of the spiral extending outwardly from within the track for sealing purposes. This results in minimizing the opportunity for damage to occur to the sealing member thereby ensuring a satisfactory EMI sealing operation. In addition to this, the sealing of the element 44 against the surface 54 is not dependent upon lateral registration of sealing surfaces to ensure satisfactory results. Instead the sealing surfaces of the element 44 and of the strip 52 face forwardly or rearwardly for abutting contact. As a consequence, accurate lateral positioning of the sealing surfaces is not required. As may be seen therefore, the surface 54 may be sufficiently wide to enable the sealing element 44 to be loosely contained between the walls 48 so as to provide it with some lateral freedom of movement while still sealing successfully against the surface 54 at any of an infinite number of positions laterally of that surface. Clearly therefore the sealing arrangement of the embodiment reliably provides for a satisfactory EMI seal without having undue dimensional and registration restraints.

It is not essential for the sealing member to be a spiral element or to be a spiral element with the configuration shown in the figures. For instance, in an alternative arrangement (not shown), the flat strip configuration of the spiral may be replaced by one which is formed from circular section wire with the spaces between the spirals being designed to provide a satisfactory minimum spacing between the spirals when the module is within the shelf to prevent EMI radiation passing between them.

Figure 8:
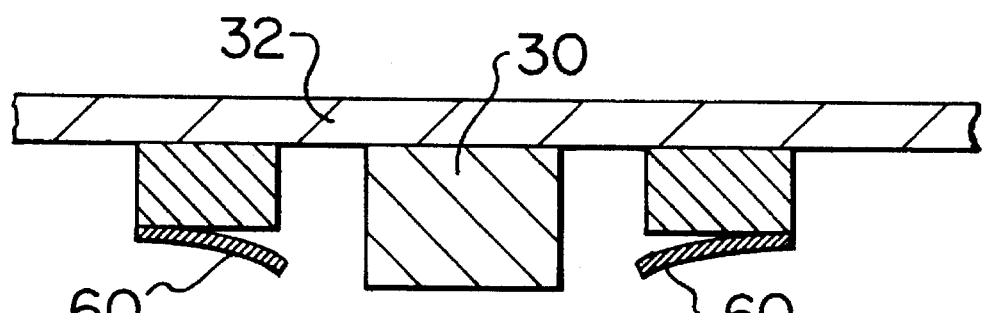
FIG. 8 is a cross-sectional view through an electronic module according to a second embodiment.
Figure 9:
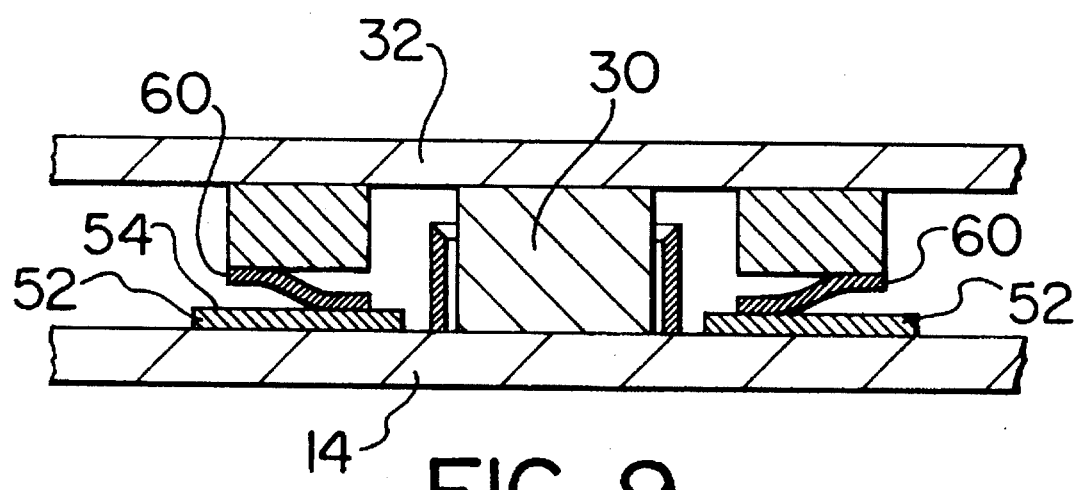
FIG. 9 is a view similar to FIG. 8 showing the electronic module fitted to a back plane.

Also, as shown by a second embodiment illustrated in FIGS. 8 and 9, the spiral element 44 is not an essential feature in this invention. As shown by FIG. 8, in which features having the same construction as in the first embodiment bear the same reference numerals, a module 12 has on its rear wall 32, a different sealing structure which eliminates the use of the track 42 and sealing element 44. Instead, in the second embodiment sealing means comprises two long, resilient linear strips 60 the strips 60 extending one along each side of the connector 30 and two shorter resilient strips of the same configuration extending above the top and below the bottom of the connector. The strips are secured to the rear wall 32 (by means not shown) so as to extend in cantilever fashion inwardly towards each other in the embodiment (or outwardly in an alternative arrangement). In this embodiment the back plane 14 is of the construction described in the first embodiment and again has the metal strip 52 with the sealing surface 54. When the module 12 is fitted into the shelf and the connector is connected with the back plane 14 (FIG. 10), the strips 60 engage the surface 54 and are caused to flex towards the rear wall 32 of the module 12 while providing an EMI seal against the surface 54. Any gaps which are existing between the ends of the strips are narrowed as the strips are resiliently flexed so as to avoid emission of radiation between them. The structure of the second embodiment has the same advantages as those discussed with regard to the first embodiment.

What is claimed is:

1. An electronic module comprising a plurality of circuit packs relatively disposed with major surfaces of the packs laterally spaced apart, the circuit packs having rear ends and being electrically interconnected at their rear ends to a rearwardly located printed circuit board extending laterally of the circuit packs, the circuit packs and the rearwardly located printed circuit board housed together within a housing for providing an electromagnetic radiation shield, and the rearwardly located printed circuit board having a single connector extending in a rearward direction and accessible exteriorly of the housing for connection to a back plane.

2. A module according to claim 1 wherein a circuit pack of the module is electrically interconnected to another circuit pack of the module directly through the rearwardly located circuit board.

3. An assembly comprising:

an electronic shelf having a front with an opening for insertion of electronic modules into receiving stations of the shelf and also having a back plane extending across the rear of the shelf;

and at least one electronic module disposed within a receiving station of the shelf, the module comprising a plurality of circuit packs relatively disposed with major surfaces of packs laterally spaced apart, the circuit packs having rear ends and being electrically interconnected at their rear ends to a rearwardly located printed circuit board extending laterally of the circuit packs, the circuit packs and the rearwardly located printed circuit board housed together within the housing for providing an electromagnetic radiation shield, and the rearwardly located printed circuit board having a single connector extending in a rearward direction and accessible exteriorly of the housing and electrically connected to the back plane.

4. An electronic module for insertion into an electronic shelf and having a rear end and a connector at the rear end for electrical interconnection with the back plane of the shelf, the module further comprising an EMI shielding means extending around the connector, the shielding means comprising at least one spiral metal member having spirals extending along a longitudinal axis of the member, the member disposed with axially aligned circumferentially extending parts of outer surfaces of the spirals facing rearwardly and providing an electromagnetic sealing surface means facing in the rearward direction, the spirals being resiliently flexible radially relative to the longitudinal axis whereby the sealing surface means is resiliently flexibly movable forwardly upon forward pressure being applied to the sealing surface, and support means is provided which allows for the radial resilient flexing of the spirals.

5. A module according to claim 4, wherein the support means comprises a channel and the spiral metal member is retained within the channel with the sealing surface means projecting rearwardly outwards from the channel and being resiliently deformable radially inwardly and towards the inside of the channel.

6. A module according to claim 4 wherein the spiral metal member is formed from flat metal strip with the strip oriented with the width of the strip extending longitudinally of the spiral and flat outer surface parts of the succeeding spirals lying in alignment longitudinally of the metal member to provide the sealing surface means.

7. A module according to claim 4 wherein the shielding means comprises at least one leaf spring which is resiliently flexible in a forward direction.

8. A module according to claim 7 wherein the leaf spring comprises a cantilever spring having a free end which is resiliently flexible in the forward direction.

9. A combination comprising:

an electronic shelf having a front with an opening for insertion of a plurality of electronic modules into receiving stations of the shelf, and also a back plane extending across a rear of the shelf;

a plurality of electronic modules each having a rear end and a connector at the rear end for electrical interconnection with the back plane, the module further comprising an EMI shielding means extending around the connector, the shielding means having an electromagnetic sealing surface means facing in the rearward direction, the sealing surface means being resiliently flexibly movable forwardly upon forward pressure being applied to the sealing surface;

and the back plane having a forwardly facing electrically conductive abutment sealing surface for sealing the engaging sealing surface means when the module is disposed in the receiving station and for providing forward pressure for resiliently flexing the sealing surface means to provide a resilient seal, the abutment sealing surface also having a grounding means.

10. A combination according to claim 9 wherein the abutment sealing surface is provided by a planar conductive metal seating member which is provided upon the back plane.

* * * * *